(12) United States Patent
Pinto et al.

(10) Patent No.: US 7,892,908 B2
(45) Date of Patent: Feb. 22, 2011

(54) INTEGRATION SCHEME FOR CHANGING CRYSTAL ORIENTATION IN HYBRID ORIENTATION TECHNOLOGY (HOT) USING DIRECT SILICON BONDED (DSB) SUBSTRATES

(75) Inventors: Angelo Pinto, San Diego, CA (US); Frank S. Johnson, Wappingers Falls, NY (US); Benjamin P. McKee, Richardson, TX (US); Shaofeng Yu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 7 days.

(21) Appl. No.: 12/343,794

(22) Filed: Dec. 24, 2008

(65) Prior Publication Data

US 2009/0159933 A1 Jun. 25, 2009

Related U.S. Application Data

(60) Provisional application No. 61/016,543, filed on Dec. 24, 2007.

(51) Int. Cl.
*H01L 21/8238* (2006.01)
*H01L 21/335* (2006.01)

(52) U.S. Cl. .................. 438/199; 438/221; 438/233; 438/275; 438/296; 438/424; 257/E21.633; 257/E21.618

(58) Field of Classification Search .................. 438/150, 438/198, 221, 296, 509, 199, 275, 233, 424; 257/E21.633, E21.632, E21.618
See application file for complete search history.

(56) References Cited

U.S. PATENT DOCUMENTS

| 7,378,306 B2 * | 5/2008 | Spencer et al. ............... 438/199 |
| 2007/0246781 A1 * | 10/2007 | Tsuchiaki ................... 257/369 |

* cited by examiner

*Primary Examiner*—Julio J Maldonado
(74) *Attorney, Agent, or Firm*—Jacqueline J. Garner; Wade J. Brady, III; Frederick J. Telecky, Jr.

(57) ABSTRACT

Optimizing carrier mobilities in MOS transistors in CMOS ICs requires forming (100)-oriented silicon regions for NMOS and (110) regions for PMOS. Methods such as amorphization and templated recrystallization (ATR) have disadvantages for fabrication of deep submicron CMOS. This invention is a method of forming an integrated circuit (IC) which has (100) and (110)-oriented regions. The method forms a directly bonded silicon (DSB) layer of (110)-oriented silicon on a (100)-oriented substrate. The DSB layer is removed in the NMOS regions and a (100)-oriented silicon layer is formed by selective epitaxial growth (SEG), using the substrate as the seed layer. NMOS transistors are formed on the SEG layer, while PMOS transistors are formed on the DSB layer. An integrated circuit formed with the inventive method is also disclosed.

14 Claims, 6 Drawing Sheets

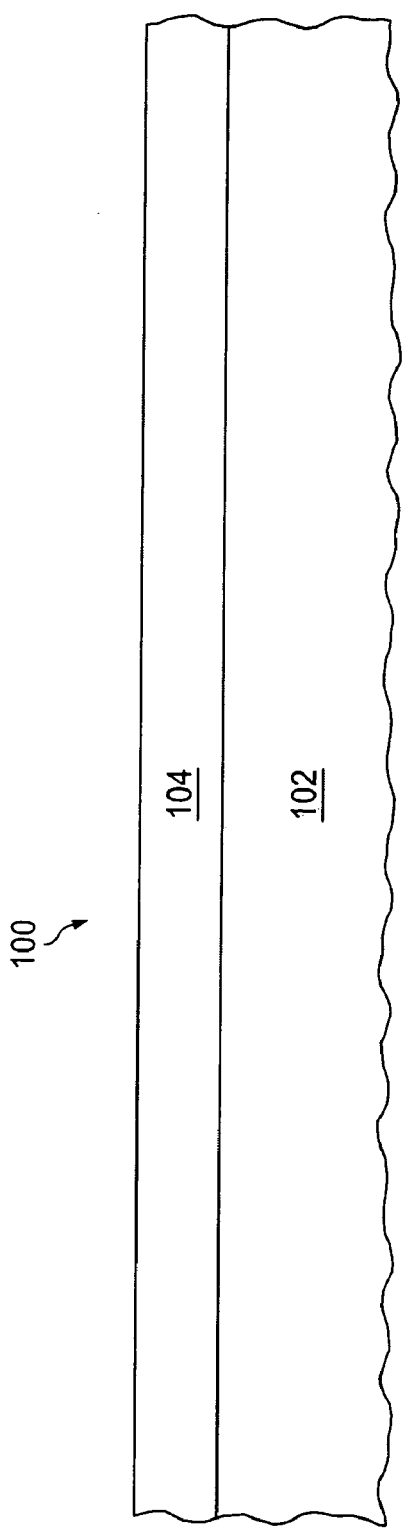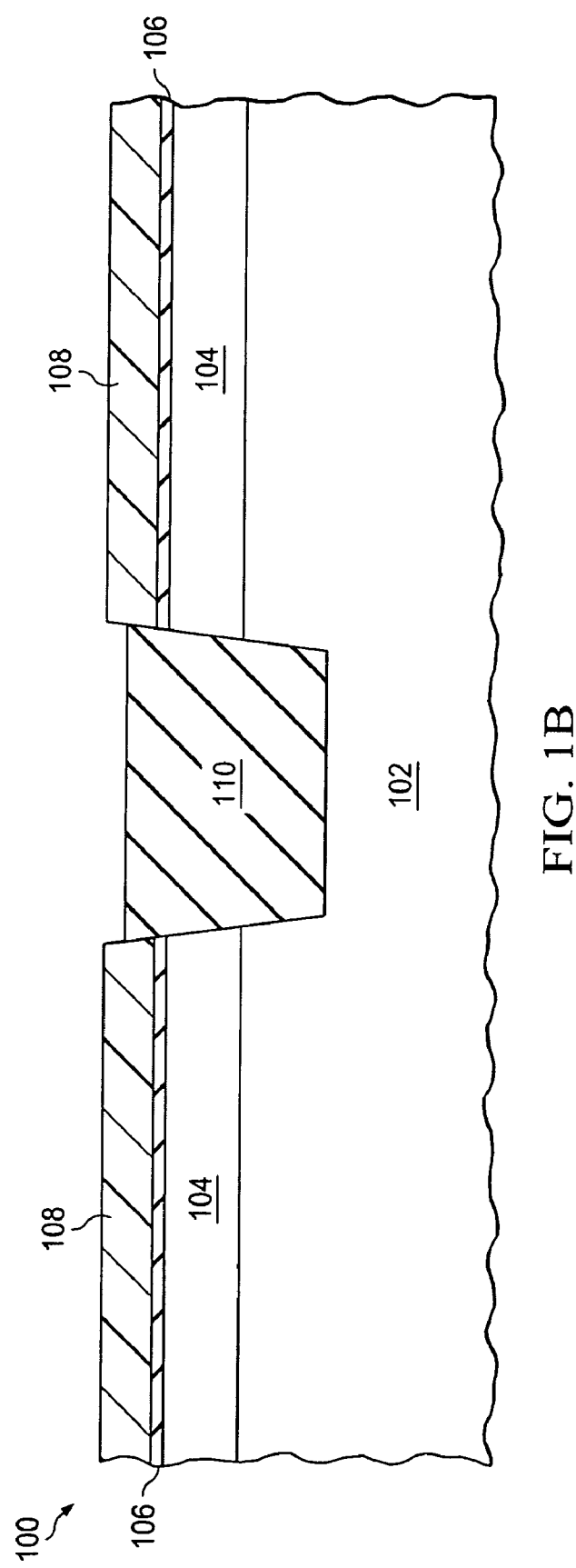

INTEGRATION SCHEME FOR CHANGING CRYSTAL ORIENTATION IN HYBRID ORIENTATION TECHNOLOGY (HOT) USING DIRECT SILICON BONDED (DSB) SUBSTRATES

FIELD OF THE INVENTION

This invention relates to the field of integrated circuits. More particularly, this invention relates to methods to fabricate integrated circuits containing regions with different crystal orientations.

BACKGROUND OF THE INVENTION

It is well recognized that increasing the mobility of charge carriers in metal oxide semiconductor (MOS) transistors in integrated circuits (ICs) improves the operating speed of ICs. There are several techniques used in advanced ICs to increase the mobilities of electrons and holes in silicon n-channel MOS (NMOS) and p-channel (PMOS) transistors, including orienting the silicon substrate to take advantage of the fact that carrier mobility varies depending on the orientation of the crystal lattice in the MOS transistor channel. Electrons have maximum mobility in (100)-oriented silicon when the NMOS transistor is aligned on a [110] axis, that is, when the electron movement in the NMOS transistor channel is along a [110] axis. Note that the notation "(100)-oriented silicon" refers to a crystal orientation in which the vector 1·x+0·y+0·z, or its equivalent, is perpendicular to the surface of the crystal, while the notation [110] axis refers to a direction parallel to the vector 1·x+1·y+0·z, or its equivalent. Holes have maximum mobility in (110)-oriented silicon when the PMOS transistor is aligned on a [110] axis. To maximize the mobilities of electrons and holes in the same IC requires regions with (100)-oriented silicon and (110)-oriented silicon in the substrate, known as hybrid orientation technology (HOT). Known methods of HOT include amorphization and templated recrystallization (ATR) which introduces defects adjacent to shallow trench isolation (STI) structures. Reduction of the ATR defects requires annealing at temperatures higher than 1250 C., which introduces wafer distortions, making fabrication of deep submicron MOS transistors difficult and costly.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

This invention provides a method of forming an integrated circuit (IC) which has two types of regions with different silicon crystal lattice orientations, (100)-oriented silicon and (110)-oriented silicon, for forming transistors, in order to optimize performance parameters, such as carrier mobility, for NMOS and PMOS transistors separately. The method starts with a single crystal substrate of (100)-oriented silicon, and forms a directly bonded silicon (DSB) layer of (110)-oriented silicon on the top surface of the substrate. Shallow trench isolation (STI) field oxide is formed to separate the regions for NMOS transistors from the regions for PMOS transistors. The DSB layer is removed in the regions for NMOS transistors and a (100)-oriented silicon layer is formed by selective epitaxial growth (SEG), using the (100)-oriented silicon of the substrate as the seed layer for the SEG layer. The SEG layer is planarized with respect to the DSB layer. NMOS transistors are formed on the SEG layer, in which the (100) orientation maximizes the electron mobility, while PMOS transistors are formed on the DSB layer, in which the (110) orientation maximizes the hole mobility. An integrated circuit formed with the inventive method is also disclosed.

DESCRIPTION OF THE VIEWS OF THE DRAWING

FIG. 1A through FIG. 1G are cross-sections of an integrated circuit during fabrication of NMOS and PMOS transistors according to an embodiment of the instant invention.

DETAILED DESCRIPTION

Figure 1C:
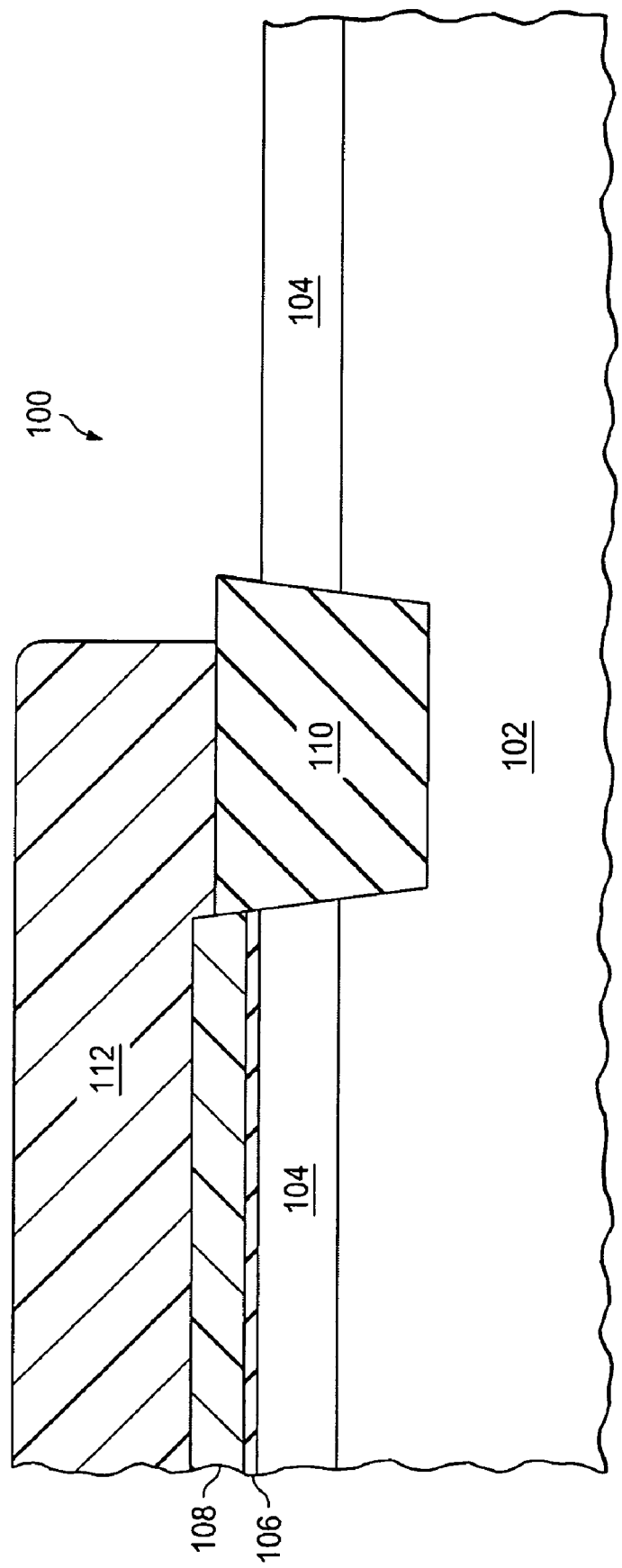

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

To assist readability of this disclosure, silicon crystal orientations will be referred to using the nomenclature "(100)-oriented silicon" or "(110)-oriented silicon" to avoid confusion with numerical designations of elements in the figures attached to this disclosure, for example "the field oxide (100)."

The instant invention addresses the need for a robust and cost effective method of fabricating integrated circuits (ICs) with regions of different crystal lattice orientation, known as hybrid orientation technology (HOT), by providing a hybrid substrate in which a layer of (110)-oriented silicon is directly bonded to a (100)-oriented silicon wafer substrate, defining regions for NMOS transistors, removing the (110)-oriented directly bonded silicon (DSB) layer in the NMOS regions to expose the (100)-oriented silicon of the wafer substrate, and forming (100)-oriented silicon in these regions by selective epitaxial growth (SEG), using the (100)-oriented silicon in the wafer substrate for a seed layer.

FIG. 1A through FIG. 1G are cross-sections of an integrated circuit during fabrication of NMOS and PMOS transistors according to an embodiment of the instant invention.

FIG. 1A is a cross-section of a hybrid substrate (100), which includes a substrate (102) of (100)-oriented silicon, typically p-type with a resistivity of 1 to 100 ohm-cm, and a DSB layer (104) of (110)-oriented silicon, typically p-type with an electrical resistivity of 1 to 100 ohm-cm, on a top surface of the substrate (102). The DSB layer (104) is 100 to 250 nanometers thick. In one embodiment, the DSB layer (104) is substantially undoped. In a further embodiment, germanium or carbon atoms may be added to change a material property, such as increase stress in the DSB layer (104) which can be advantageous by increasing transistor on-state drive current.

FIG. 1B depicts the IC (100) after field oxide regions have been formed by a shallow trench isolation (STI) process. A layer of pad oxide (106), typically silicon dioxide 5 to 50 nanometers thick grown by thermal oxidation, is formed on a top surface of the DSB layer (104). A layer of active area hard mask (108), typically silicon nitride 50 to 250 nanometers thick deposited by chemical vapor deposition (CVD), is formed on a top surface of the pad oxide layer (106). Field oxide regions (110), typically silicon dioxide formed by an STI process, extend from a top surface of the active area hard mask layer (108) through the substrate (102) into DSB layer (104). The field oxide (110) is typically 200 to 500 nanometers thick. Commonly, a top surface of the field oxide (110) is within 50 nanometers of the top surface of the active area hard mask after the STI process is completed. Some active area hard mask layer material is removed by the STI process, which includes a chemical mechanical polish (CMP) step.

FIG. 1C depicts the IC (100) after formation of a photoresist pattern (112) on a top surface of the active area hard mask (108) and a top surface of the field oxide (110) to define regions for NMOS transistors, and removal of the active area hard mask and pad oxide in these regions. The photoresist pattern (112) is formed using known photolithographic techniques, including depositing a layer of photoresist on the top surfaces of the active area hard mask (108) and field oxide (110), exposing the photoresist layer in the regions for NMOS transistors to radiation, typically ultraviolet light, through a mask, or "reticle," containing the pattern for the regions for NMOS transistors, by means of commonly available photolithographic equipment, also known as a "wafer stepper," and exposing the photoresist layer to a developing fluid which dissolves the exposed photoresist, leaving a photoresist pattern which has open areas in the regions defined for NMOS transistors. The mask containing the pattern for the regions for NMOS transistors may be a mask used to define p-type wells later in the fabrication process sequence.

Still referring to FIG. 1C, the active area hard mask layer is removed in regions exposed by the photoresist pattern (112), by known etching techniques, commonly a plasma containing fluorine and oxygen, to expose the pad oxide layer. Similarly, the pad oxide layer is removed in these regions by known etching techniques, commonly a plasma containing fluorine.

Figure 1D:
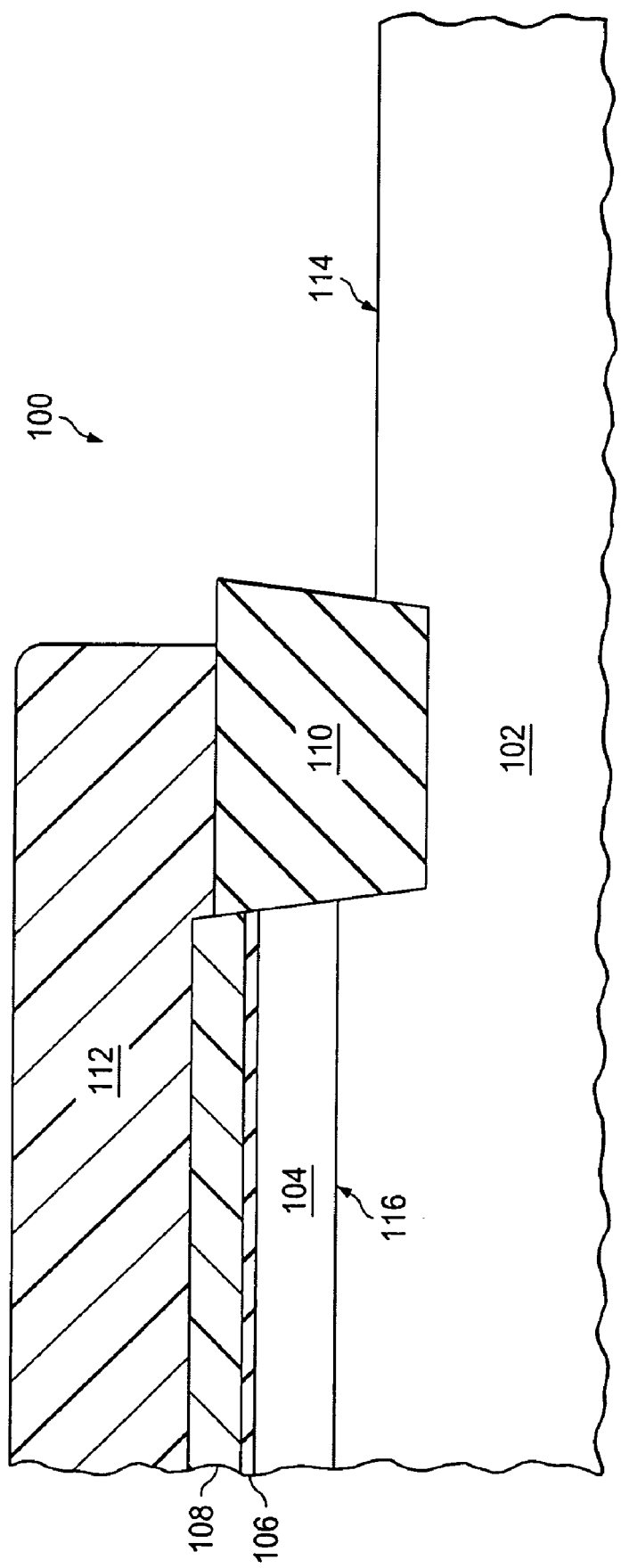

FIG. 1D depicts the IC (100) after the DSB layer (104) has been removed in regions defined for NMOS transistors. The DSB layer (104) is etched using known etching techniques, commonly a plasma containing bromine and/or chlorine. A portion of the silicon in the substrate (102) in the region defined for NMOS transistors is removed by the etching process, in order to provide a suitable surface for selective epitaxial growth (SEG). This results in a top surface (114) of the substrate (102) in the region defined for NMOS transistors being lower than an interface (116) between the substrate (102) and the DSB layer (104). In one embodiment of the instant invention, the etching process detects a signature when (100)-oriented silicon in the substrate is etched, allowing tighter control of the vertical offset between the surface (114) and the interface (116). In another embodiment, the etch process is run for a fixed time, calculated from known etch rates. The DSB etch process may produce a step in the top surface of the field oxide (110). After the DSB etch process is completed, the photoresist pattern (112) is removed by known techniques of etching with an oxygen-containing plasma followed by wet etching. After the photoresist pattern (112) is removed, the IC (100) may be annealed to relieve stress in the substrate (102), densify the field oxide (110) and improve the substrate surface (114) for epitaxial growth in a subsequent step. In one embodiment, the anneal occurs at temperatures greater than 900° C.

Figure 1E:
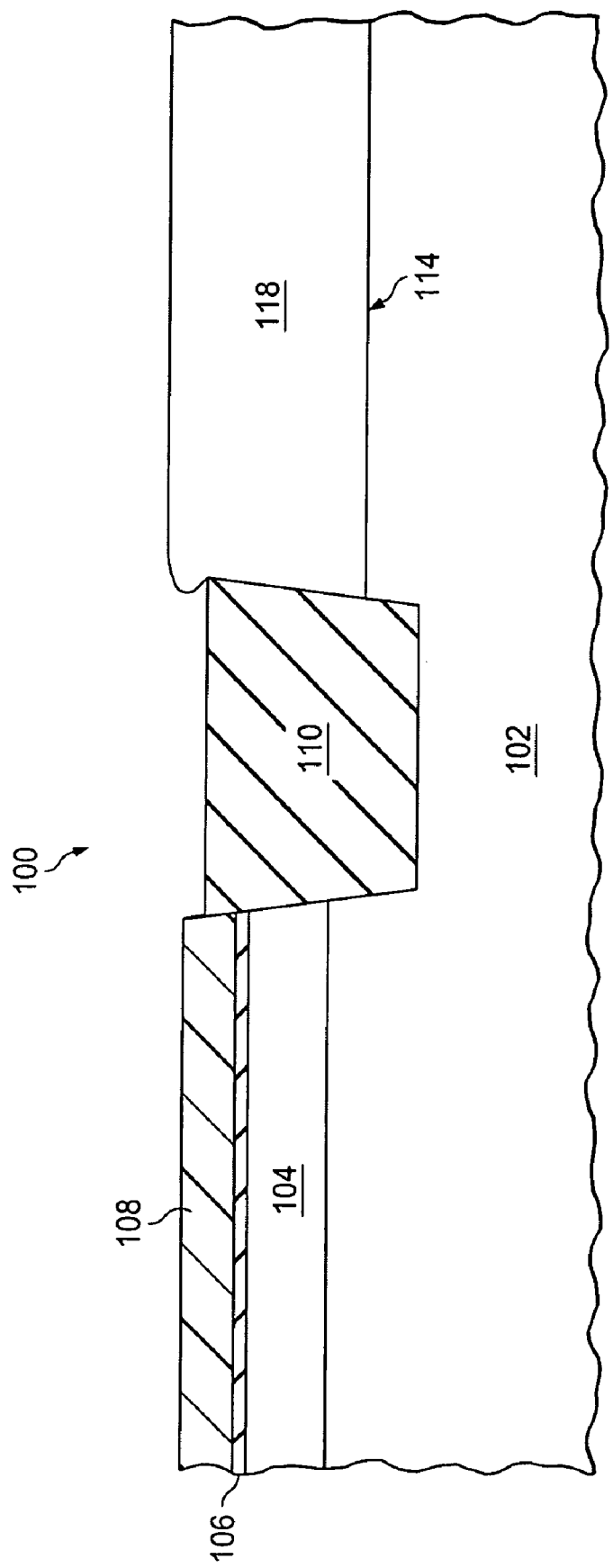

FIG. 1E depicts the IC (100) after an SEG layer (118) is grown on surface (114) of the substrate (102). Growth of the SEG layer (118) is accomplished using known techniques of selective epitaxial growth in the presence of oxide and nitride, such that little or no silicon material is formed on top surfaces of the active area hard mask (108) or the field oxide (110), for example by using a mixture of SiH4 gas and HCl gas at a temperature of 1020 C., or a mixture of SiH2Cl2 gas, H2 gas and HCl gas at a temperature of 950 C. The use of other known selective epitaxial growth techniques is within the scope of this invention. In one embodiment, the SEG layer (118) may be substantially pure silicon. In another embodiment, p-type dopant atoms such as boron or gallium may be added. In a further embodiment, germanium or carbon atoms may be added to improve a material property of the SEG layer (118), such as increase stress in the SEG layer (118), which can be advantageous by increasing transistor on-state drive current. Growth rates of the SEG layer (118) range may from 1 to 100 nanometers/minute, depending on growth conditions and equipment used. The crystal orientation of the SEG layer (118) is the same as the substrate (102), namely (100)-oriented silicon. A top surface of the SEG layer (118) is substantially even with, or higher than a top surface of the DSB layer (104).

Figure 1F:
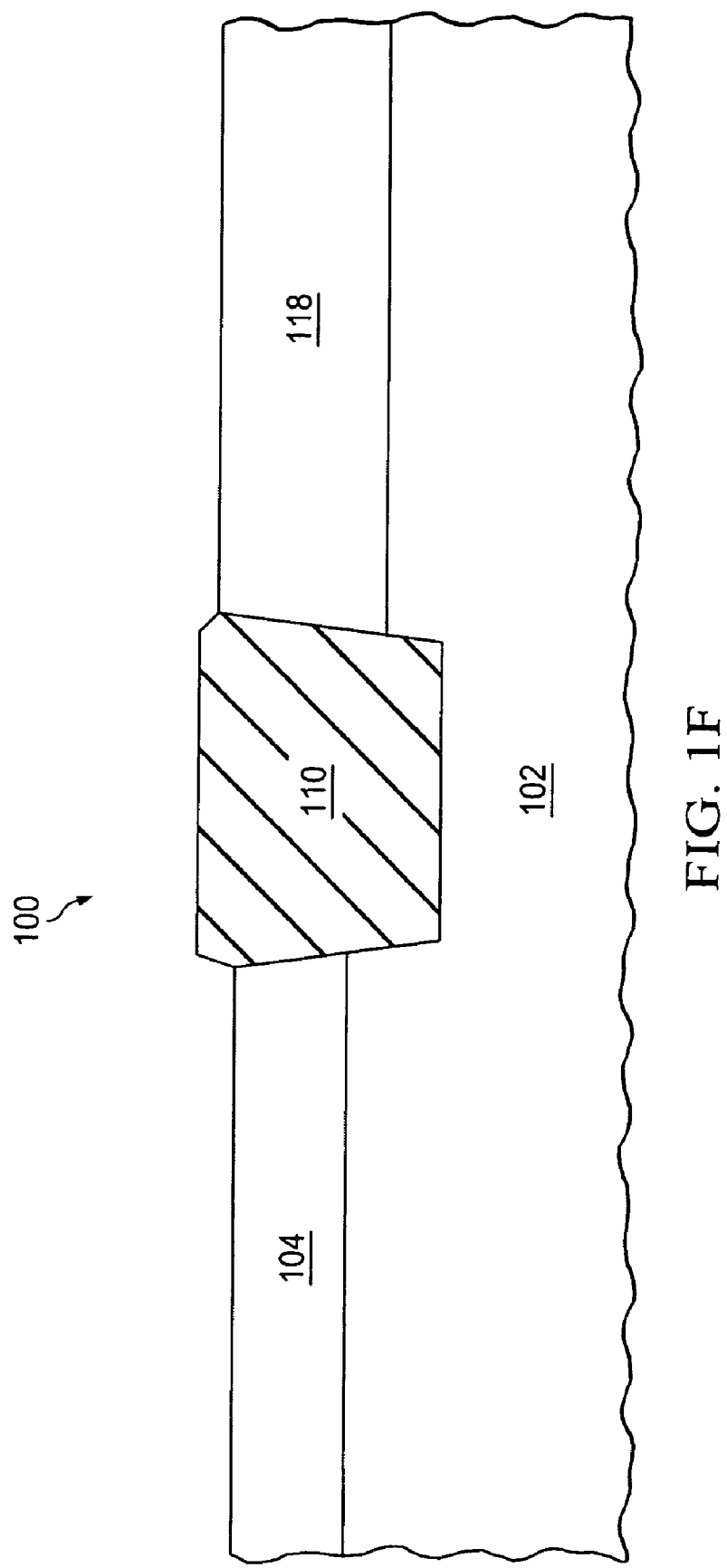

The inventive method continues with optional planarization of the SEG layer, as depicted in FIG. 1F. A silicon CMP process, using known silicon polishing techniques, removes material from a top surface of the SEG layer (118) until it is substantially even with a top surface of the DSB layer (104). During the silicon CMP process, material is removed from a top surface of the field oxide (110). The active area hard mask layer and pad oxide are removed by known etching techniques, including phosphoric acid etching of the active area hard mask layer and HF-based etching of the pad oxide layer. An optional anneal in an O2 gas ambient may be performed to further passivate an interface between the SEG layer (118) and the field oxide region (110). In one embodiment, the optional anneal is performed at a temperature greater than 900° C.

Figure 1G:
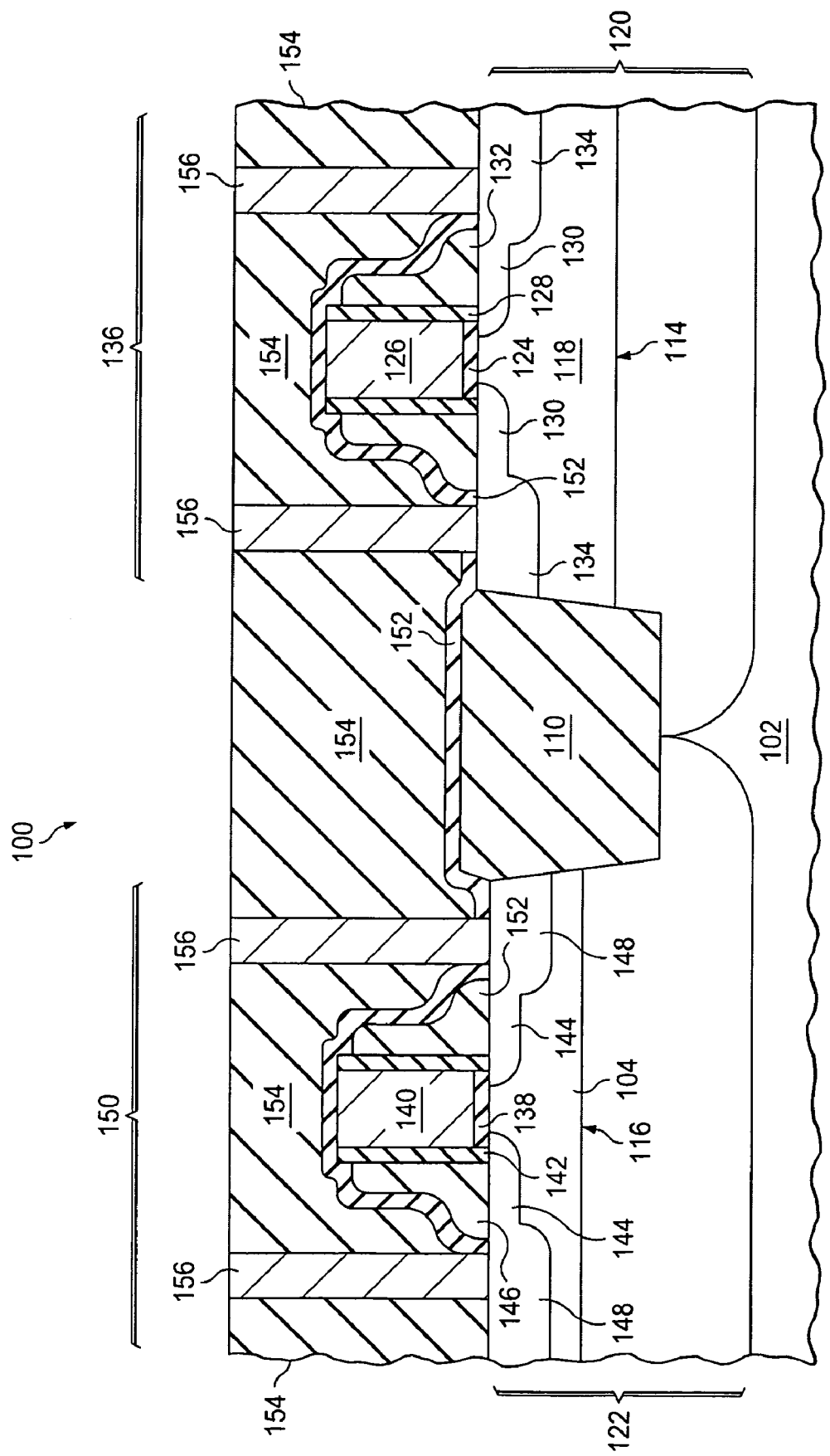

Fabrication of an integrated circuit on the HOT substrate prepared according to the instant invention is depicted in FIG. 1G. A p-type well (120) is formed in the regions defined for NMOS transistors by known methods of ion implanting p-type dopants such as boron, BF2 or indium, commonly in several steps with doses from $1 \cdot 10^{10}$ to $1 \cdot 10^{14}$ cm$^{-2}$ at energies from 2 keV to 200 keV. Similarly, an n-type well (122) is formed in regions defined for PMOS transistors by known methods of ion implanting n-type dopants such as phosphorus, arsenic or antimony, commonly in several steps with doses from $1 \cdot 10^{10}$ to $1 \cdot 10^{14}$ cm$^{-2}$ at energies from 1 keV to 500 keV. Formation of an NMOS transistor proceeds with formation of an NMOS gate dielectric layer (124), typically silicon dioxide, nitrogen doped silicon dioxide, silicon oxynitride, hafnium oxide, layers of silicon dioxide and silicon nitride, or other insulating material, on a top surface of the p-type well (120), followed by formation of an NMOS gate (126), typically polycrystalline silicon, on a top surface of the NMOS gate dielectric layer (124), with NLDD offset spacers (128), typically one or more layers of silicon dioxide and/or silicon nitride formed by plasma etch, with a width from 1 to 30 nanometers, on lateral surfaces of the NMOS gate (126). N-type medium doped drain regions (NLDD) (130) are formed in the p-type well (120) adjacent to the NMOS gate (126) by ion implantation of n-type dopants such as phosphorus, arsenic and/or antimony, commonly in several steps with doses from $1 \cdot 10^{13}$ to $1 \cdot 10^{16}$ cm$^{-2}$ at energies from 1 keV to 10 keV. Typical depths of n-type dopants in the NLDD (130) range from 5 to 50 nanometers. Following ion implantation of n-type dopants into the NLDD (130), NMOS gate sidewall spacers (132) are formed on lateral surfaces of the NLDD offset spacers (128), commonly by deposition of layers of silicon dioxide and silicon nitride spacer material followed by anisotropic etchback to remove spacer material from horizontal surfaces of the IC (100). Typical NMOS gate sidewall spacer widths range from 3 to 100 nanometers. Following formation of the NMOS gate sidewall spacers (132), NMOS source and drain regions (NSD) (134) are formed by in the p-type well (120) adjacent to the NMOS gate sidewall spacers (132) by ion implantation of n-type dopants such as phosphorus, arsenic and/or antimony, commonly in several steps with doses from $1 \cdot 10^{14}$ to $1 \cdot 10^{16}$ cm$^{-2}$ at energies from 3 keV to 50 keV. Typical depths of n-type dopants in the NSD (134) range from 10 to 250 nanometers. In a preferred embodiment, the thickness of the DSB layer (104) and the etch process to remove the DSB layer are adjusted so that the interface (114) between the substrate (102) and the SEG layer (118) is below a space charge region of the NSD. Anneals may be performed after the NLDD ion implants and the NSD ion implants to repair damage to the silicon lattice of the SEG layer (118) by the ion implantation processes. The p-type well (120), NMOS gate dielectric layer (124), NMOS gate (126), NLDD offset spacers (128), NLDD (130), NMOS gate sidewall spacers (132) and NSD (134) form an NMOS transistor (136). Optional layers of metal silicide may be formed on top surfaces of the NSD (132) and NMOS gate (126) to decrease electrical resistance of contacts made to the NSD (132) and NMOS gate (126).

Still referring to FIG. 1G, fabrication of the integrated circuit (100) continues with formation of a PMOS transistor. A PMOS gate dielectric layer (138), typically silicon dioxide, nitrogen doped silicon dioxide, silicon oxy-nitride, hafnium oxide, layers of silicon dioxide and silicon nitride, or other insulating material, on a top surface of the n-type well (122), followed by formation of an PMOS gate (140), typically polycrystalline silicon, on a top surface of the PMOS gate dielectric layer (138), with PLDD offset spacers (142), typically one or more layers of silicon dioxide and/or silicon nitride formed by plasma etch, with a width from 1 to 30 nanometers, on lateral surfaces of the PMOS gate (140). P-type medium doped drain regions (PLDD) (144) are formed in the n-type well (122) adjacent to the PMOS gate (140) by ion implantation of p-type dopants such as boron, BF2 and/or gallium, commonly in several steps with doses from $1 \cdot 10^{13}$ to $1 \cdot 10^{16}$ cm$^{-2}$ at energies from 0.3 keV to 10 keV. Typical depths of p-type dopants in the PLDD (144) range from 5 to 50 nanometers. Following ion implantation of p-type dopants into the PLDD (144), PMOS gate sidewall spacers (146) are formed on lateral surfaces of the PLDD offset spacers (142), commonly by deposition of layers of silicon dioxide and silicon nitride spacer material followed by anisotropic etchback to remove spacer material from horizontal surfaces of the IC (100). Typical PMOS gate sidewall spacer widths range from 3 to 100 nanometers. Following formation of the PMOS gate sidewall spacers (146), PMOS source and drain regions (PSD) (148) are formed by in the n-type well (122) adjacent to the PMOS gate sidewall spacers (146) by ion implantation of p-type dopants such as boron, BF2 and/or gallium, commonly in several steps with doses from $1 \cdot 10^{14}$ to $1 \cdot 10^{16}$ cm$^{-2}$ at energies from 3 keV to 50 keV. Typical depths of p-type dopants in the PSD (148) range from 10 to 250 nanometers. In a preferred embodiment, the thickness of the DSB layer (104) is adjusted so that the interface (116) between the substrate (102) and the DSB layer (104) is below a space charge region of the PSD. Anneals may be performed after the PLDD ion implants and the PSD ion implants to repair damage to the silicon lattice of the DSB layer (104) by the ion implantation processes. The n-type well (122), PMOS gate dielectric layer (138), PMOS gate (140), PLDD offset spacers (142), PLDD (144), PMOS gate sidewall spacers (146) and PSD (148) form an PMOS transistor (150). Optional layers of metal silicide may be formed on top surfaces of the PSD (144) and PMOS gate (140) to decrease electrical resistance of contacts made to the PSD (144) and PMOS gate (140).

Still referring to FIG. 1G, fabrication of the IC (100) continues with formation of a pre-metal dielectric liner (PMD liner) (152), typically silicon nitride, 2 to 100 nanometers thick, on top surfaces of the NMOS transistor (136), the PMOS transistor (150) and the field oxide (110). In some embodiments, a dual stress layer (DSL) PMD liner is formed, which applies different levels of stress to different components in the IC, such as compressive stress on PMOS transistors and tensile stress on NMOS transistors. A pre-metal dielectric layer (PMD) (154), typically silicon dioxide, 152 to 1000 nanometers thick, is formed on a top surface of the PMD liner (152). Contacts (156) to the NSD (148) and PSD (134) are formed by etching holes in the PMD (154) and PMD liner (152) to expose portions of the top surfaces of the NSD (148) and PSD (134), and filling the holes with metals, typically tungsten. The contacts (156) allow electrical connections to be made to the NMOS and PMOS transistors (136, 150).

The formation of the NMOS transistor (136) in the SEG layer (118) is advantageous because the (100)-oriented silicon in the SEG layer maximizes the electron mobility in an NMOS channel, and thus maximizes the NMOS on-state drive current. The formation of the PMOS transistor (150) in the DSB layer is advantageous because the (110)-oriented silicon in the DSB layer maximizes the hole mobility in a PMOS channel, and thus maximizes the PMOS on-state drive current.

It is within the scope of this invention to exchange the silicon crystal lattice orientations of the substrate, DSB layer and SEG layer, and form a p-type well and an NMOS transistor in the DSB layer and an n-type well and a PMOS transistor in the SEG layer, and realize the same advantages with respect to maximization of on-state drive currents explained above.

The silicon crystal lattice orientations of the substrate and DSB layer may be altered from the (100) and (110) orientations described in the embodiments above, to suit a particular application, for example a radiation resistant IC, and still fall within the scope of this invention. This invention generally discloses a method to obtain regions with two silicon crystal lattice orientations for electronic components, and is not limited to the (100) and (110) orientations, nor to transistors as the only components formed in the DSB and SEG layers.

Those skilled in the art to which the invention relates will appreciate that the described implementations are merely illustrative example embodiments, and that there are many other embodiments and variations of embodiments that can be implemented within the scope of the claimed invention.

What is claimed is:

1. A method of forming an integrated circuit, comprising the steps of:

providing a substrate comprised of silicon having a first crystal lattice orientation;

forming a layer of directly bonded silicon (DSB) having a second crystal lattice orientation to a top surface of said substrate;

forming regions of shallow trench isolation (STI) field oxide in said DSB layer extending into said substrate;

forming a hard mask layer on a top surface of said DSB layer to define a first region for a first type of MOS transistor, whereby:

said top surface of said DSB layer is exposed in said first region; and a boundary of said hard mask layer is on a top surface of said field oxide;

removing said DSB layer in said first region by etching processes to expose a top surface of said substrate;

forming a selective epitaxial growth (SEG) layer of silicon having said first crystal lattice orientation on said top surface of said substrate in said first region by selective epitaxial growth, in a manner that forms substantially no silicon on a top surface of said hard mask layer or said field oxide;

forming a first type of well in said SEG layer and said substrate in said first region by ion implanting a first type of dopants;

forming a second type of well in a second region in said DSB layer and said substrate that is different than said first region by ion implanting a second type of dopants;

forming a first type of MOS transistor on and in said first type of well;

forming a second type of MOS transistor in said second type of well;

forming a pre-metal dielectric (PMD liner on top surfaces of said first type of MOS transistor, said second type of MOS transistor and said field oxide region;

forming a PMD layer on a top surface of said PMD liner; and forming contacts in said PMD layer and said PMD liner to make electrical connections to said first type of MOS transistor and said second type of MOS transistor.

2. The method of claim 1, in which:

said first crystal lattice orientation is a (100) orientation;
said second crystal lattice orientation is a (110) orientation;
said first type of well is a p-type well;
said first type of dopants are p-type dopants;
said second type of well is an n-type well;
said second type of dopants are n-type dopants;
said first type of MOS transistor is an n-channel MOS transistor; and
said second type of MOS transistor is a p-channel MOS transistor.

3. The method of claim 2, in which a thickness of said DSB layer is between 150 and 250 nanometers.

4. The method of claim 3, further comprising the step of planarizing said SEG layer by a process of chemical mechanical polish (CMP) to be substantially even with said top surface of said DSB layer.

5. The method of claim 4, further comprising the step of annealing said substrate at a temperature greater than 900 C after said step of removing said DSB layer.

6. The method of claim 4, further comprising the step of annealing said SEG layer at a temperature greater than 900 C in an oxygen containing ambient after said step of forming an SEG layer.

7. The method of claim 5, in which:

said process step of forming an n-channel MOS transistor further comprises the steps of:

forming an NMOS gate dielectric layer on a top surface of said p-type well;

forming an NMOS gate on a top surface of said NMOS gate dielectric layer;

forming n-type medium doped drain (NLDD) offset spacers on lateral surfaces of said NMOS gate;

forming NLDD regions in said p-type well adjacent to said NMOS gate by ion implanting n-type dopants;

forming NMOS gate sidewall spacers on lateral surfaces of said NLDD offset spacers; and forming NMOS source and drain (NSD) regions in said p-type well adjacent to said NMOS gate sidewall spacers by ion implanting n-type dopants; and said process step of forming a p-channel MOS transistor further comprises the steps of:

forming a PMOS gate dielectric layer on a top surface of said n-type well;

forming a PMOS gate on a top surface of said PMOS gate dielectric layer;

forming P-type medium doped drain (PLDD) offset spacers on lateral surfaces of said PMOS gate;

forming PLDD regions in said n-type well adjacent to said PMOS gate by ion implanting p-type dopants;

forming PMOS gate sidewall spacers on lateral surfaces of said PLDD offset spacers; and forming PMOS source and drain (PSD) regions in said n-type well adjacent to said PMOS gate sidewall spacers by ion implanting p-type dopants.

8. The method of claim 7, in which an interface between said SEG layer and said substrate is below a space charge region of said NSD regions.

9. A method of forming an integrated circuit, comprising the steps of:

providing a substrate, comprised of (110)-oriented silicon;

forming a layer of (100)-oriented directly bonded silicon (DSB) to a top surface of said substrate;

forming regions of field oxide in said layer of DSB such that the field oxide extends into said substrate, by a process further comprising the steps of:

forming a layer of pad oxide on a top surface of said DSB layer;

forming a layer of active area hard mask on a top surface of said pad oxide layer;

etching a trench through said active area hard mask layer, pad oxide layer, said DSB layer and extending into said substrate, in a region defined for field oxide; and filling said trench with dielectric material;

forming a photoresist pattern on a top surface of active area hard mask and a top surface of said field oxide to define a region for a PMOS transistor, so that the region for PMOS transistors is exposed;

removing said active area hard mask layer and said pad oxide layer in said region for an PMOS transistor by etching processes to expose a top surface of said DSB layer;

removing said DSB layer in said region for an PMOS transistor by etching processes to expose a top surface of said substrate;

forming a selective epitaxial growth (SEG) layer of (110)-oriented silicon on said top surface of said substrate in said region for an PMOS transistor by selective epitaxial growth, in a manner that forms substantially no silicon on the top surface of said active area hard mask layer or said field oxide;

forming an n-type well in said SEG layer and said substrate in said region for an PMOS transistor by ion implanting n-type dopants;

forming a p-type well in a region for a NMOS transistor in said DSB layer and said substrate that is different than said region for an PMOS transistor by ion implanting p-type dopants;

forming a PMOS transistor on and in said n-type well by a process further comprising the steps of;

forming a PMOS gate dielectric layer on a top surface of said n-type well;

forming a PMOS gate on a top surface of said PMOS gate dielectric layer;

forming P-type medium doped drain (PLDD offset spacers on lateral surfaces of said PMOS gate;

forming PLDD regions in said n-type well adjacent to said PMOS gate by ion implanting p-type dopants;

forming PMOS gate sidewall spacers on lateral surfaces of said PLDD offset spacers; and forming PMOS source and drain (PSD regions in said n-type well adjacent to said PMOS gate sidewall spacers by ion implanting p-type dopants;

forming an NMOS transistor on and in said p-type well by a process further comprising the steps of;

forming an NMOS gate dielectric layer on a top surface of said p-type well;

forming an NMOS gate on a top surface of said NMOS gate dielectric layer;

forming N-type medium doped drain (NLDD offset spacers on lateral surfaces of said NMOS gate;

forming NLDD regions in said p-type well adjacent to said NMOS gate by ion implanting n-type dopants;

forming NMOS gate sidewall spacers on lateral surfaces of said NLDD offset spacers; and forming NMOS source and drain (NSD regions in said p-type well adjacent to said NMOS gate sidewall spacers by ion implanting n-type dopants;

forming a pre-metal dielectric (PMD) liner on top surfaces of said NMOS transistor, said PMOS transistor and said field oxide region;

forming a PMD layer on a top surface of said PMD liner; and forming contacts in said PMD layer and said PMD liner to make electrical connections to said NSD regions and said PSD regions.

10. The method of claim 9, in which a thickness of said DSB layer is between 150 and 250 nanometers.

11. The method of claim 10, in which an interface between said SEG layer and said substrate is below a space charge region of said PSD regions.

12. The method of claim 11, further comprising the step of planarizing said SEG layer by a process of chemical mechanical polish (CMP) to be substantially even with said top surface of said DSB layer.

13. The method of claim 12, further comprising the step of annealing said substrate at a temperature greater than 900 C after said step of removing said DSB layer.

14. The method of claim 12, further comprising the step of annealing said SEG layer at a temperature greater than 900 C in an oxygen containing ambient after said step of forming an SEG layer.

\* \* \* \* \*